United States Patent [19]
Gardner et al.

[11] Patent Number: 5,976,924
[45] Date of Patent: Nov. 2, 1999

[54] METHOD OF MAKING A SELF-ALIGNED DISPOSABLE GATE ELECTRODE FOR ADVANCED CMOS DESIGN

[75] Inventors: Mark I. Gardner, Cedar Creek; Derick J. Wristers; H. Jim Fulford, both of Austin, all of Tex.

[73] Assignee: Advanced Micro Devices, Inc., Sunnyvale, Calif.

[21] Appl. No.: 09/000,599

[22] Filed: Dec. 30, 1997

[51] Int. Cl.$^6$ .................................................... H01L 21/31
[52] U.S. Cl. .......................... 438/230; 438/438; 257/369
[58] Field of Search .................................... 438/230, 217, 438/163, 223, 438, 183, 300, 299; 257/369, 315

[56] References Cited

U.S. PATENT DOCUMENTS

| | | | |
|---|---|---|---|
| 3,853,633 | 12/1974 | Armstrong | 438/217 |
| 4,520,553 | 6/1985 | Kraft | 438/297 |
| 5,116,771 | 5/1992 | Karulkar | 438/163 |
| 5,391,510 | 2/1995 | Hsu et al. | 438/301 |
| 5,399,508 | 3/1995 | Nowak | 438/291 |
| 5,559,368 | 9/1996 | Hu et al. | 257/369 |

FOREIGN PATENT DOCUMENTS

05283425  10/1993  Japan ........................... H01L 21/336

OTHER PUBLICATIONS

Stanley Wolf and Richard N.Tauber, Silicon Processing for the VLSI Era, vol. 2, pp. 144–152, 182–188, 318, 332–333, 419–439, Dec. 1990.

Stanley Wolf and Richard N. Tauber, Silicon Processing for the VLSI Era vol. 3, pp. 367–407, Dec. 1995.

Stanley Wolf and Richard N. Tauber, Silicon Processing for the VLSI Era, vol. 2—Processing Integration, pp. 144–152, 182–188, 318, 332–333, 419–439, Dec. 1990, Publication U.S.

Stanley Wolf and Richard N. Tauber, Silicon Processing for the VLSI Era, vol. 3—The Submicron MOSFET, pp. 367–407, Dec. 1995, Publicaton U.S.

*Primary Examiner*—Wael M. Fahmy
*Assistant Examiner*—William David Coleman
*Attorney, Agent, or Firm*—Timothy M. Honeycutt

[57] ABSTRACT

A method of fabricating an integrated circuit transistor in a substrate is provided wherein a self-aligned gate electrode is formed after the high temperature steps associated with sidewall spacer formation and source/drain anneal. A first dielectric layer is formed on a substrate. First and second source/drain regions are formed in the substrate and spaced laterally to define a channel region underlying the first dielectric layer. A second dielectric layer is formed on the substrate except where the first dielectric layer is positioned. The first dielectric layer is removed and a third dielectric layer is formed that overlies the channel region. A gate electrode is formed on the third dielectric layer. The first dielectric layer functions as a disposable gate electrode to facilitate self-aligned source/drain implant and sidewall spacer formation.

31 Claims, 4 Drawing Sheets

5,976,924

METHOD OF MAKING A SELF-ALIGNED DISPOSABLE GATE ELECTRODE FOR ADVANCED CMOS DESIGN

BACKGROUND OF THE INVENTION

1. Field of the Invention

This invention relates generally to semiconductor processing, and more particularly, to a method of fabricating an integrated circuit transistor using a disposable dielectric layer.

2. Description of the Related Art

Insulated gate field effect transistors ("IGFET"), such as metal oxide semiconductor field effect transistors ("MOSFET"), are some of the most commonly used electronic components in modem integrated circuits. Embedded controllers, microprocessors, analog-to-digital converters, and many other types of devices now routinely include millions of MOSFETs. The dramatic proliferation of MOSFETs in integrated circuit design can be traced to their high switching speeds, potentially low power dissipation, and adaptability to semiconductor process scaling.

A typical MOSFET implemented in silicon consists of a source and a drain formed in a silicon substrate, and separated laterally to define a channel region in the substrate. A gate electrode composed of a conducting material, such as aluminum or polysilicon, is disposed over the channel region and designed to emit an electric field into the channel region. Changes in the electric field emitted by the gate electrode enable, or alternatively, disable the flow of current between the source and the drain.

In a conventional process flow for forming a typical MOSFET, a gate oxide layer is grown on a lightly doped silicon substrate and a layer of polysilicon is deposited on the gate oxide layer. The polysilicon and the gate oxide are then anisotropically etched back to the upper surface of the substrate leaving a polysilicon gate electrode stacked on top of a gate oxide layer. Following formation of the polysilicon gate electrode, a source and a drain are formed by implanting a dopant species into the substrate. The gate electrode acts as a hard mask against the implant so that the source and drain are formed in the substrate self-aligned to the gate electrode. Many conventional semiconductor fabrication processes employ a double implant process to form the source and drain. First implant is performed self-aligned to the gate electrode to establish lightly doped drain ("LDD") structures. After the LDD implant, dielectric sidewall spacers are formed adjacent to the gate electrode by depositing and anisotropically etching a dielectric material, such as silicon dioxide. The second of the two source/drain implants is then performed self-aligned to the sidewall spacers. The substrate is then annealed to activate the dopant in the source and the drain. Salicidation steps frequently follow the formation of the source and drain.

The conventional self-aligned gate and source/drain formation process has been widely practiced in the industry for a number of years. One of the principle benefits of using such a self-aligned process is the ability to form channel regions with predictable dimensions, and to form gate electrodes without the requirement for additional masking steps that may be subject to photolithographic misalignment errors. However, there are certain disadvantages associated with the conventional self-aligned gate and source/drain formation process. First, the gate electrode is formed prior to the high temperature thermal processing steps associated with the formation of the sidewall spacers and the anneal of the source and drain. These high temperature thermal processes, if performed after the formation of the gate electrode, may cause contaminants to diffuse from the gate electrode into the channel region or vice versa. In either case, the electrical performance of the transistor may be diminished. Second, the dielectric material used to form the sidewall spacers is commonly composed of silicon dioxide formed by an oxidation reaction with an oxygen bearing ambient and the silicon substrate. The silicon dioxide growth rate for undoped or very lightly doped silicon substrates is such that the step of forming the silicon dioxide layer consumes processing time that might otherwise be eliminated or devoted to other steps in the process.

The present invention is directed to overcoming or reducing one or more of the foregoing disadvantages.

SUMMARY OF THE INVENTION

In accordance with one aspect of the present invention, a method of forming self-aligned sidewall spacers for a gate electrode of an integrated circuit transistor in a substrate is provided. The method includes the steps of forming a first dielectric layer on the substrate and forming first and second source/drain regions in the substrate such that the first and second source drain/regions are laterally spaced to define a channel region underlying the first dielectric layer. A second dielectric layer is formed on the substrate except where the first dielectric layer is positioned. The first dielectric layer is removed.

In accordance with another aspect of the present invention, a method of fabricating an integrated circuit transistor in a substrate is provided. The method includes the steps of forming a first dielectric layer on the substrate and forming first and second source/drain regions in the substrate such that the first and second source drain/regions are laterally spaced to define a channel region underlying the first dielectric layer. A second dielectric layer is formed on the substrate. The first dielectric layer is removed. A third dielectric layer is formed that overlies the channel region. A gate electrode is formed on the third dielectric layer.

In accordance with another aspect of the present invention, a method of fabricating an integrated circuit transistor in a substrate is provided. The method includes the steps of forming a first dielectric layer on the substrate and implanting the substrate with arsenic to form first and second source/drain regions in the substrate. The first and second source/drain regions are laterally spaced to define a channel region underlying the first dielectric layer. A second dielectric layer is formed on the substrate except where the first dielectric layer is positioned. The first dielectric layer is removed. A gate oxide layer is formed to overlie the channel region. A gate electrode is formed on the gate oxide layer.

In accordance with still another aspect of the present invention, a method of fabricating an integrated circuit transistor in a substrate is provided. The method includes the steps of forming a dielectric layer on the substrate and forming first and second source/drain regions in the substrate such that the first and second source drain/regions are laterally spaced to define a channel region underlying the dielectric layer. A layer of silicon dioxide is formed on the substrate. The dielectric layer is removed. A second layer of silicon dioxide is formed overlying the channel region. A gate electrode is formed on the second silicon dioxide layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
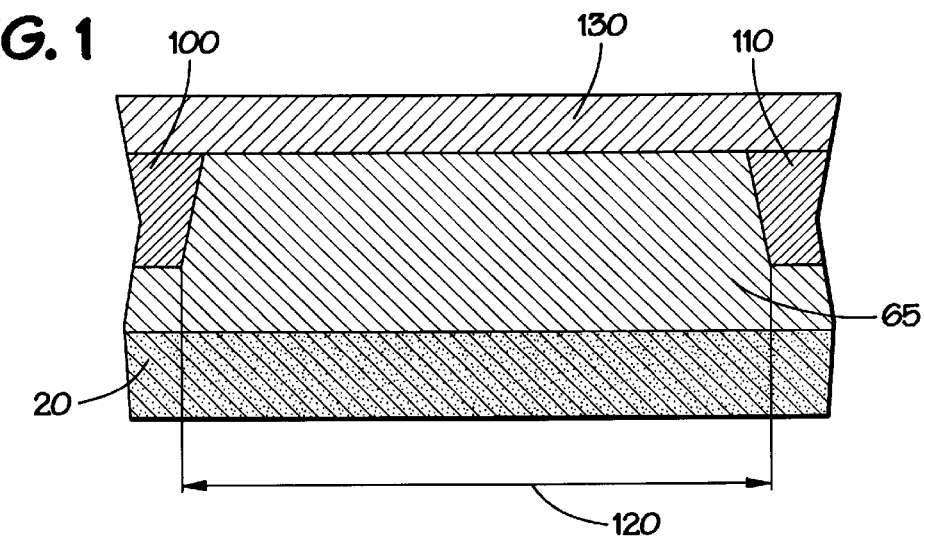
FIG. 1 is a cross-sectional view of an exemplary substrate and depicts application of a first dielectric layer in accordance with the present invention.

In the drawings described below, reference numerals are generally repeated where identical elements appear in more than one figure. Turning now to the drawings, and initially to FIG. 8, there is shown a cross-sectional view of an exemplary embodiment of an integrated circuit transistor ("transistor") 10 in accordance with the present invention. The transistor 10 may be an IGFET, a MOSFET, or other type of transistor and may be n-channel or p-channel. The transistor 10 is formed on a semiconductor substrate 20 which may be composed of n-doped, or p-doped silicon, silicon-on-insulator, or other suitable substrate materials. The transistor 10 includes a gate electrode 30 formed on the substrate 20. A gate dielectric layer 40 is interposed between the substrate 20 and the gate electrode 30. Source/drain regions 50 and 60 are formed in a well 65 in the substrate and are laterally spaced to define a channel region 70 underlying the gate electrode 30. The phrase "source/drain region(s)" is used herein to describe a region that may serve as either a source or a drain. The person of ordinary skill in the art will appreciate that a source/drain region may function as a source or a drain depending upon whether it is connected to $V_{SS}$ or $V_{DD}$ during metallization. The well 65 may be an N-well or a P-well. Dielectric sidewall spacers 80 and 90 are disposed adjacent to the gate electrode 30.

Isolation trenches 100 and 110 electrically isolate the transistor 10 from other structures in the substrate 20 and define an active area 120 for the transistor 10. The isolation trenches 100 and 110 may be fabricated using well known techniques to fabricate isolation trenches, such as, for example, shallow trench isolation and reflow, deep trench isolation, or other suitable trench isolation techniques. The isolation trenches 100 and 110 are advantageously composed of a suitable dielectric material, such as $SiO_2$ or other suitable dielectric trench isolation materials.

Figure 6:
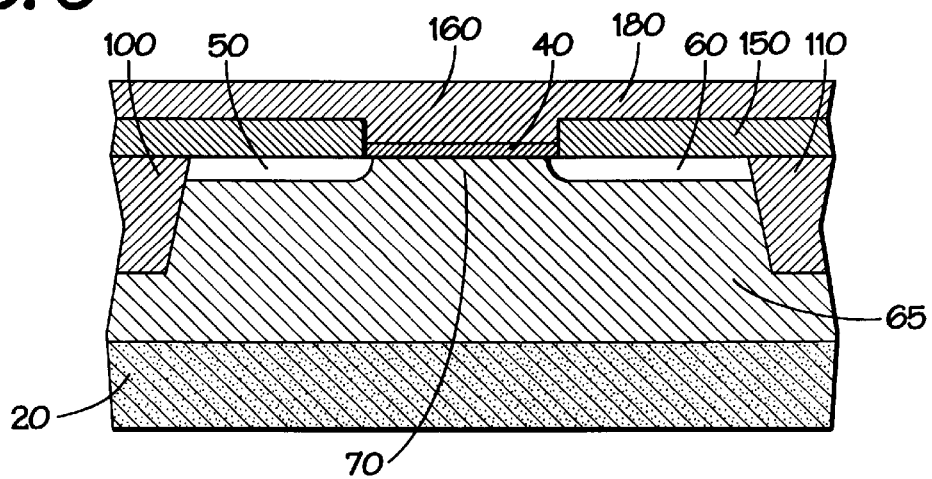
FIG. 6 is a cross-sectional view like FIG. 1 depicting application of a conductor layer on the substrate in accordance with the present invention.
Figure 7:
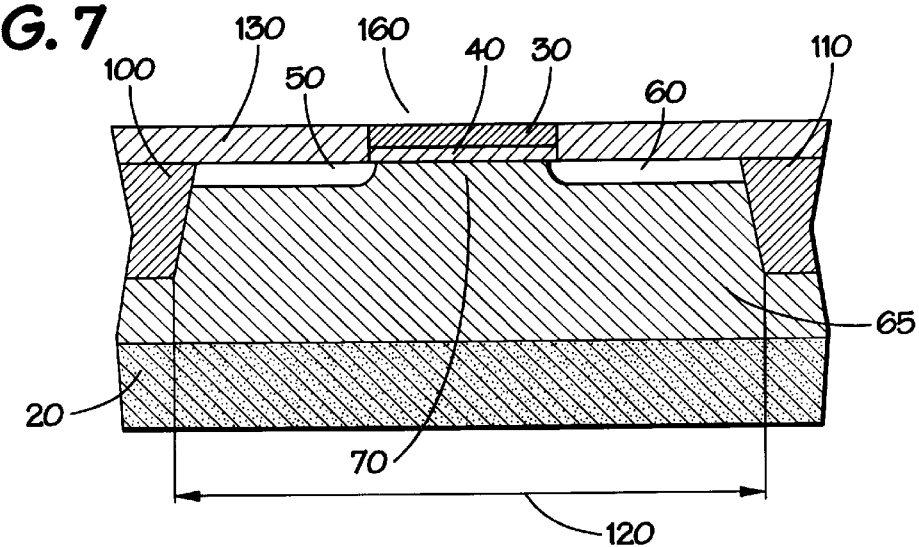
FIG. 7 is a cross-sectional view like FIG. 1 depicting planarization of the conductor layer in accordance with the present invention.
Figure 8:
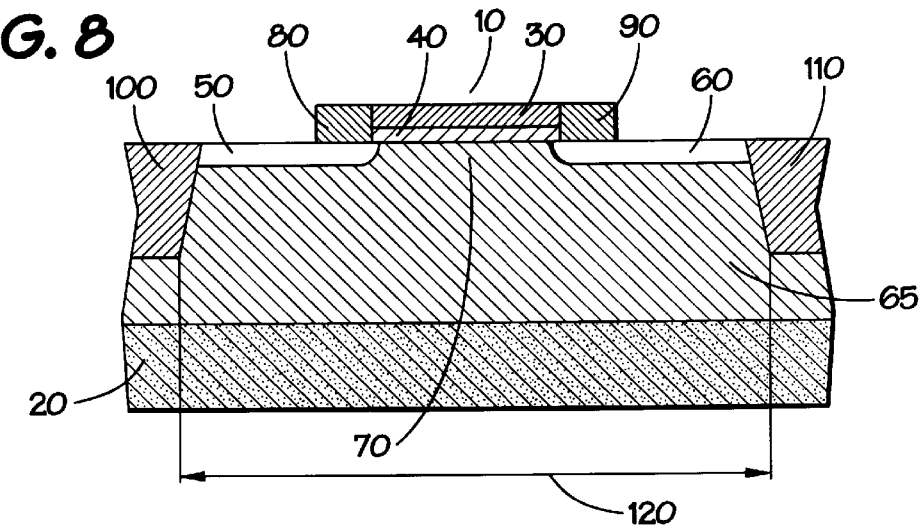
FIG. 8 is a cross-sectional view like FIG. 1 following an etch of the second dielectric layer in accordance with the present invention.

The process flow for fabricating the transistor 10 shown in FIG. 8 may be understood by referring to FIGS. 1, 2, 3, 4, 5, 6, 7, and 8. Referring initially to FIG. 1, a first dielectric layer 130 is formed on the substrate 20. The first dielectric layer 130 may be composed of $SiO_2$, $Si_3N_4$, silicon oxynitride, or other dielectric materials suitable to function as a hard mask against subsequent ion implantation as described more below. In an exemplary embodiment, the first dielectric layer 130 is silicon oxynitride. The first dielectric layer 130 may be 2000 to 5000 Å thick and is advantageously 3500 Å thick. The process to form the first dielectric layer 130 will depend on the material selected. For example, if silicon oxynitride is selected, the first dielectric layer may be formed by chemical vapor deposition ("CVD") or other suitable oxynitride formation techniques. Dry oxidation techniques or other suitable oxide formation techniques may be utilized if $SiO_2$ is selected. For example, the substrate 20 may be exposed to an $O_2$ containing ambient at approximately 700 to 1000° C. for approximately 30 to 90 minutes in a diffusion tube process.

Figure 2:
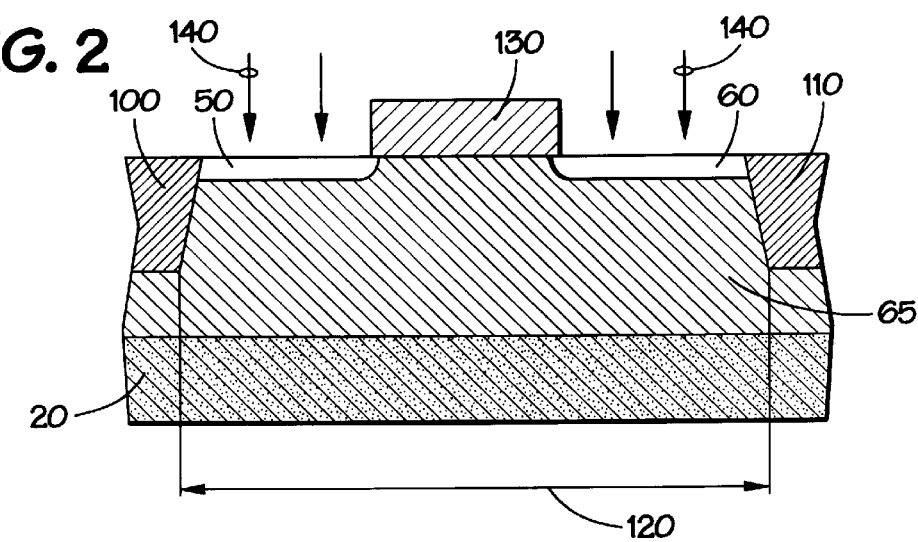
FIG. 2 is a cross-sectional view like FIG. 1 following an etch of the first dielectric layer and a source/drain implant in accordance with the present invention.

Referring now to FIG. 2, the substrate 20 is masked and patterned, and the first dielectric layer 130 anisotropically etched to expose portions of the substrate 20. The remnant of the dielectric layer 130 following the etch is in the general shape of a field effect transistor gate electrode. As discussed more below, the first dielectric layer 130 will be removed later in the process to provide-an opening for the formation of the gate electrode 30 shown in FIG. 8.

The source/drain regions 50 and 60 are formed by ion implantation as indicated by the arrows 140. The first dielectric layer 130 functions as a hard mask against the implant, enabling the source/drain regions 50 and 60 to be established laterally spaced yet self-aligned to the first dielectric layer 130. This is in contrast to a conventional fabrication process where source/drain implants are performed using a gate electrode and a gate electrode with sidewall spacers as hard masks against the implant. The dopant species for the implant will depend on the type of transistor, e.g. p-channel or n-channel. In an exemplary n-channel embodiment, the dopant is arsenic. The implant dosage may be 8E14 to 8E15 ions/cm$^2$ and is advantageously 5E15 ions/cm$^2$. The implant energy may be 1 to 60 keV and is advantageously 30 keV. The implant angle is advantageously 0°.

Figure 3:
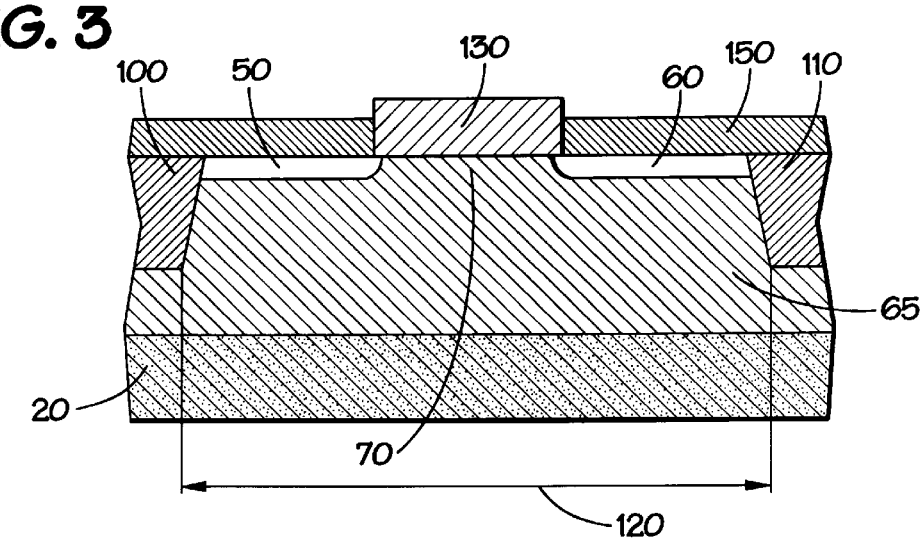
FIG. 3 is a cross-sectional view like FIG. 1 following formation of a second dielectric layer on the substrate in accordance with the present invention.

Referring now to FIG. 3, a second dielectric layer 150 is formed on the substrate 20 except where the first dielectric layer 130 is positioned. As discussed below, the second dielectric layer 150 is processed to establish the dielectric sidewall spacers 80 and 90 shown in FIG. 8. The second dielectric layer 150 may be composed of $SiO_2$, $Si_3N_4$, silicon oxynitride, or other suitable dielectric materials. However, the process in accordance with present invention contemplates removal of the portion of the first dielectric layer 130 shown in FIG. 3, while the second dielectric layer 150 is left relatively intact. Accordingly, the materials for the first dielectric layer 130 and the second dielectric layer 150 should be selected in concert so that the first dielectric layer 130 will etch selectively to the second dielectric layer 150. In an exemplary embodiment, the second dielectric layer 150 is silicon dioxide. The second dielectric layer 150 may be 500 to 3000 Å thick and is advantageously 2000 Å thick. The process to form the second dielectric layer 150 will depend on the material selected. For example, if silicon dioxide is selected, dry oxidation techniques or other suitable oxide formation techniques may be utilized. If silicon oxynitride is selected, chemical vapor deposition ("CVD") or other suitable oxynitride formation techniques may be used. If silicon dioxide is selected, the second dielectric layer 150 may be grown by exposing the substrate 20 to an $O_2$ containing ambient at approximately 700 to 1000° C. for approximately 30 to 90 minutes in a diffusion tube process.

Where $SiO_2$ is selected in conjunction with arsenic source/drain doping, the process of the present invention provides a growth rate for $SiO_2$ that is greatly accelerated over the growth rate for $SiO_2$ in a conventional fabrication process. In a conventional process where sidewall spacer material is formed after a LDD implant but before a second, and heavier, source/drain implant, the oxidation reaction involves relatively lightly doped silicon. In the present invention, the $SiO_2$ is grown in a reaction with relatively heavy arsenic doped silicon. The relatively heavy arsenic doping enhances the oxidation reaction.

The high temperature thermal step to grow the second dielectric layer 150 also serves to anneal the source/drain regions 50 and 60. Note that the arsenic dopant in the source/drain regions 50 and 60 diffuses laterally beneath the first dielectric layer 130, defining the channel region 70. The lateral diffusion of the dopant establishes a lightly doped region for each source/drain region 50 and 60 that is adjacent the channel 70.

Figure 4:
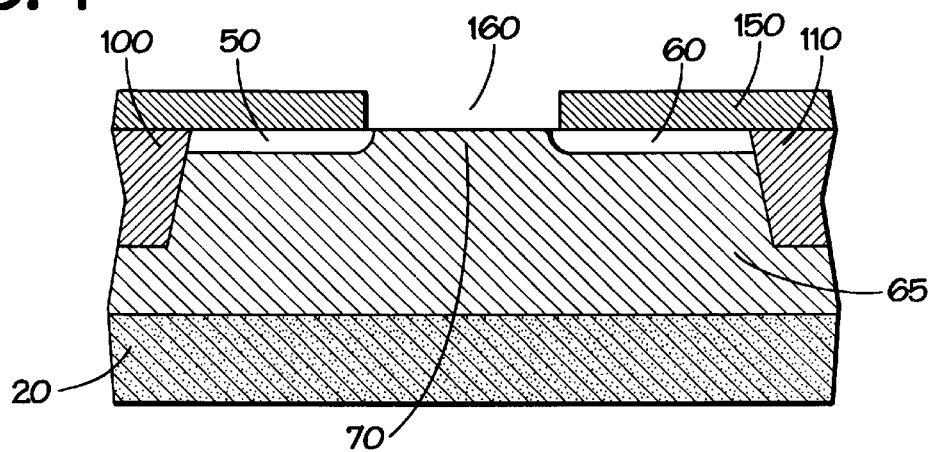
FIG. 4 is a cross-sectional view like FIG. 1 following removal of the first dielectric layer in accordance with the present invention.

Referring now to FIG. 4, the first dielectric layer 130 is removed. The appropriate removal process will depend on the material selected for the first dielectric layer 130. In an exemplary embodiment, the first dielectric layer 130 is silicon oxynitride and is stripped by wet etching in $H_3PO_4$ or plasma etching. Removal of the first dielectric layer 130 leaves an opening 160 for the gate electrode 30 (see FIG. 8) that is automatically aligned with respect to the source/drain regions 50 and 60 and the underlying channel 70.

Implants to adjust the threshold voltage $V_T$ of the transistor 10 (see FIG. 8) and to inhibit punchthrough may be performed. The energy and dosage for the $V_T$ adjust and punchthrough inhibitor implants will depend on the dopant species. For p-type dopants, such as boron, the dosage for the threshold voltage adjust implant may be 2E12 to 7E12 ions/cm$^2$ and is advantageously 7E12 ions/cm$^2$. The energy may be 10 to 30 keV and is advantageously 20 keV. For n-type dopants, such as phosphorus, the energy may be 30 to 70 keV and is advantageously 50 keV. For p-type dopants, such as boron, the dosage for the punchthrough inhibitor implant may be 1E12 to 1E13 ions/cm$^2$ and is advantageously 6E12 ions/cm$^2$. The energy may be 40 to 70 keV and is advantageously 50 keV. For n-type dopants, such as phosphorus, the energy may be 80 to 120 keV and is advantageously 100 keV.

Figure 5:
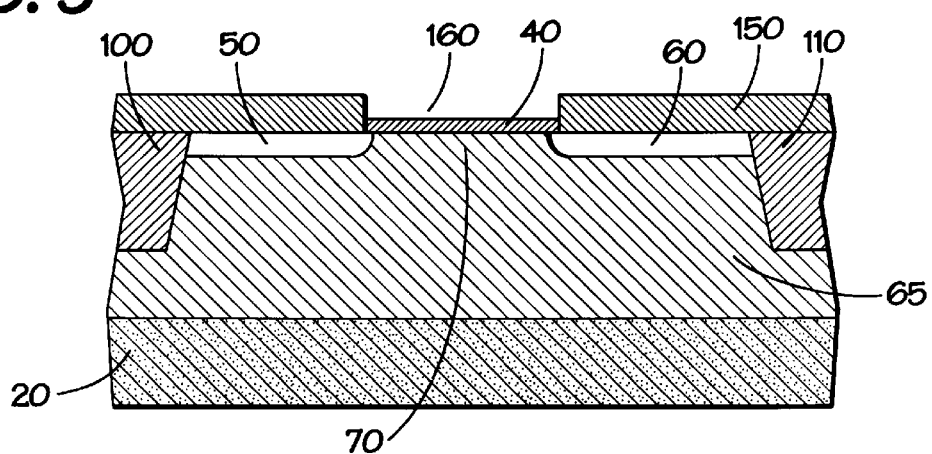
FIG. 5 is a cross-sectional view like FIG. 1 depicting formation of a third dielectric layer in accordance with the present invention.

Referring now to FIG. 5, the gate or third dielectric layer 40 is formed on the substrate 20 in the opening 160. The third dielectric layer 40 may be composed of $SiO_2$, or other materials suitable for gate dielectric layers. The third dielectric layer 40 may be 20 to 35 Å thick and is advantageously 25 Å thick. If silicon dioxide is selected, the third dielectric layer 40 may be grown by exposing the substrate 20 to an $O_2$ containing ambient at approximately 700 to 1000° C. for approximately 30 to 90 minutes in a diffusion tube process.

Referring now to FIG. 6, a conductor layer 180 is formed over the second dielectric layer 150 and the third dielectric layer 40, filling the opening 160. The conductor layer 180 may be composed of a variety of conducting materials suitable for gate electrodes, such as, for example, amorphous silicon, polysilicon, aluminum, copper, or other conducting materials. In an exemplary embodiment, the conductor layer 180 is polysilicon. Well known techniques for forming gate electrodes, such as CVD, may be used to deposit the conductor layer 180.

Referring now to FIG. 7, the conductor layer 180 shown in FIG. 6 is planarized to the second dielectric layer 150 by chemical mechanical polishing or other suitable planarization techniques. The gate electrode 30 is left in the opening 160. The gate electrode 30 may be 1500 to 2500 Å thick and is advantageously 1750 Å thick. The process in accordance with the present invention moves the high temperature steps associated with formation of the sidewall spacer material, e.g. the second dielectric layer 150, and the source/drain anneal ahead of the process to form the gate electrode 30. The result is a gate electrode 30 subjected to fewer high temperature thermal cycles.

Referring again to FIG. 8, the second dielectric layer 150 is anisotropically etched by reactive ion etching. The portions of the second dielectric layer 150 remaining after the etch consist of the dielectric sidewall spacers 80 and 90.

Figure 9:
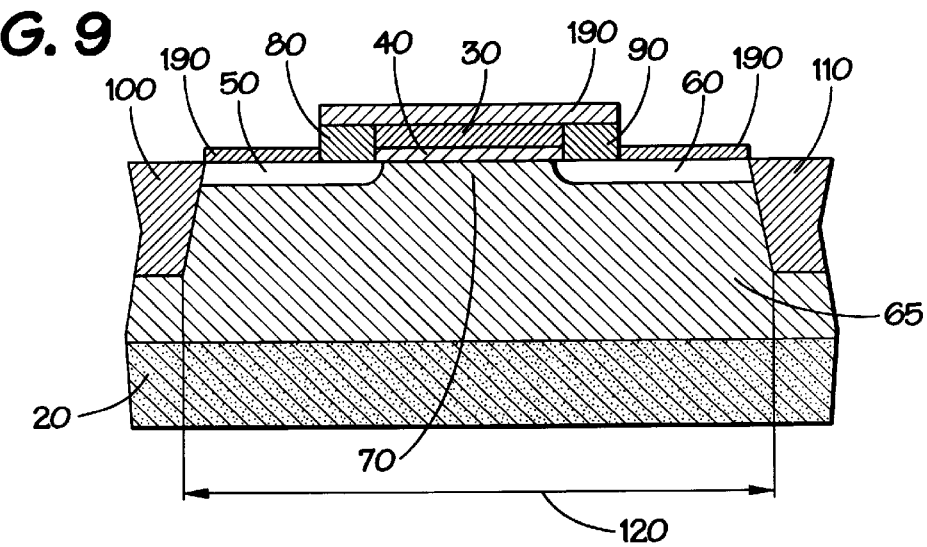
FIG. 9 is a cross-sectional view like FIG. 1 following salicidation in accordance with the present invention.

Referring now to FIG. 9, a salicide layer 190 may be formed to provide a suitable ohmic contact for any subsequent metallization. The salicide layer 190 is advantageously composed of a suitable material, such as, for example, $TiSi_2$, $CoSi$, or similar salicide materials, and is advantageously $TiSi_2$. The salicide layer 190 may be 600 to 800 Å thick, and is advantageously 700 Å thick. The salicide layer 190 is formed using well known CVD application, and RTA techniques. In this embodiment, the salicide layer 190 is also formed over the substrate 20 on either side of the gate electrode 30 and between the isolation trenches 100 and 110.

Figure 10:
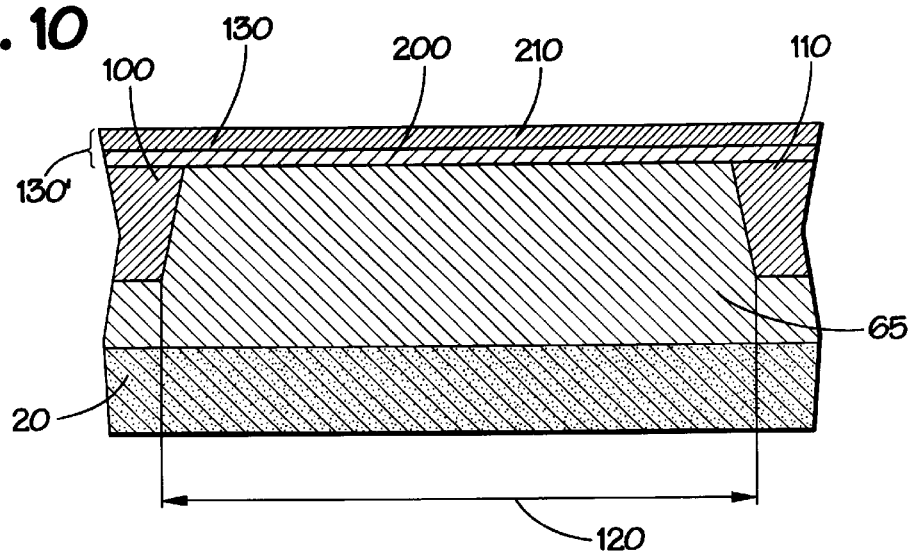
FIG. 10 is a cross-sectional view like FIG. 1 depicting an alternative application of a first dielectric layer in accordance with the present invention.
Figure 11:
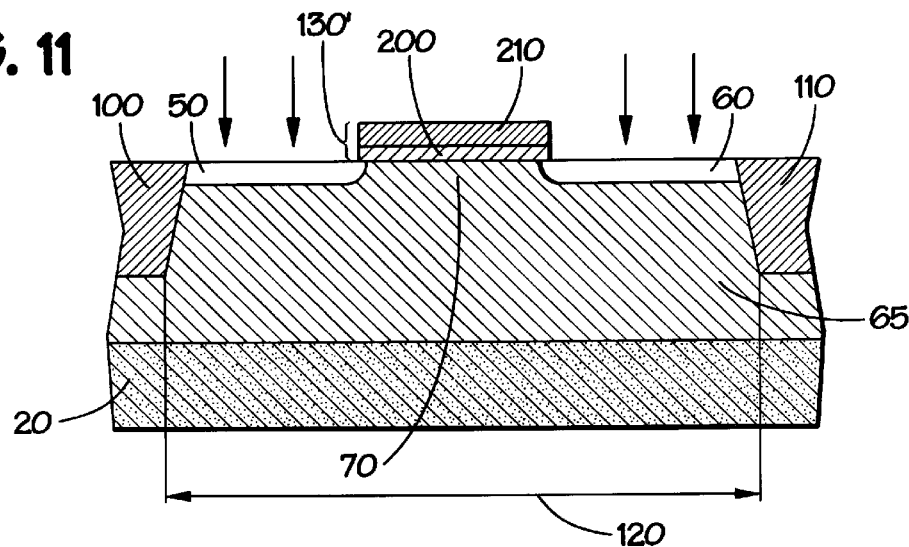
FIG. 11 is a cross-sectional view like FIG. 10 following an etch of the first dielectric layer and a source/drain implant in accordance with the present invention.
Figure 12:
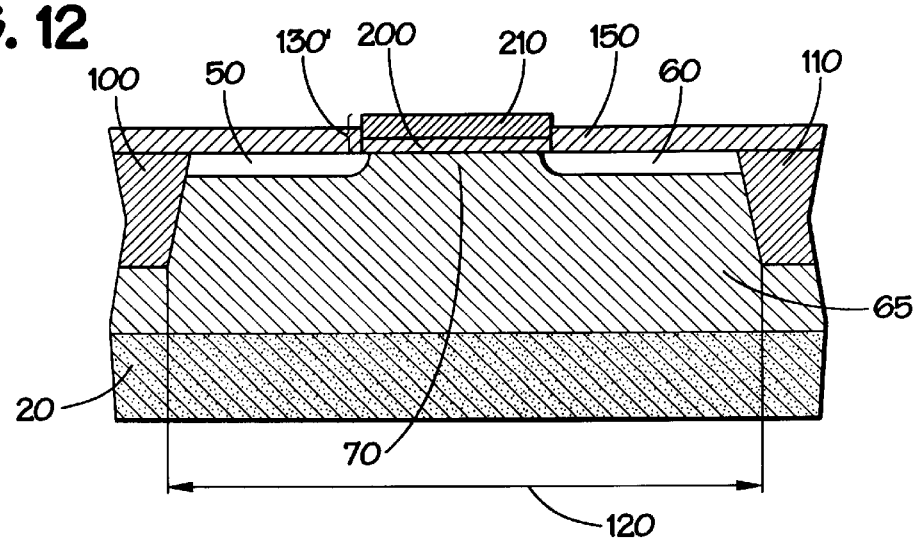
FIG. 12 is a cross-sectional view like FIG. 10 following formation of a second dielectric layer on the substrate in accordance with the present invention.

An alternate embodiment of the process flow is illustrated in FIGS. 10, 11, and 12. Referring initially to FIG. 10, the first dielectric layer 130 depicted in FIG. 1, is now designated 130'. The first dielectric layer 130' consists of a layer 200 of $SiO_2$ formed on the substrate 20 and a layer 210 of $Si_3N_4$ deposited on the layer 200. The layer 200 may be 50 to 150 Å thick and is advantageously 100 Å thick, and may be formed by the aforementioned techniques for forming $SiO_2$. The layer 210 may be 2000 to 5000 Å thick and is advantageously 3500 Å thick, and may be formed by the aforementioned CVD or plasma processes. The $Si_3N_4$ layer 210 will advantageously resist oxidation during formation of the second dielectric layer as described below.

Referring now to FIG. 11, the substrate 20 is masked and patterned, and the first dielectric layer 130' is anisotropically etched to expose portions of the substrate 20. The remnant of the dielectric layer 130' following the etch is in the general shape of a field effect transistor gate electrode. The etch process consists of a nitride etch followed by an oxide etch, advantageously by reactive ion etching. Following the etch, the substrate 20 is implanted as described above to establish the source/drain regions 50 and 60.

Referring now to FIG. 12, the second dielectric layer 150 is provided as described above. In this embodiment, the second dielectric layer 150 is $SiO_2$. The $Si_3N_4$ resists oxidation during this step. The $Si_3N_4$ layer 210 is removed by wet etching in $H_3PO_4$ or by reactive ion etching. This etch is selective to the second dielectric layer 150. The oxide layer 200 is then removed by reactive ion etching. Following removal of the layer 200, the structure shown in FIG. 4 remains. The substrate 20 may then be processed as described above and shown in FIGS. 5, 6, 7, 8, and 9.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of forming self-aligned sidewall spacers for a gate electrode of an integrated circuit transistor on a substrate, comprising the steps of:

forming a first dielectric layer on the substrate;

forming first and second source/drain regions in the substrate such that the first and second source drain/ regions are laterally spaced to define a channel region underlying the first dielectric layer;

forming a second dielectric layer on the substrate except where the first dielectric layer is positioned; and removing the first dielectric layer.

2. The method of claim 1, wherein the first dielectric comprises a layer of silicon dioxide on the substrate and a layer of silicon nitride formed on the layer of silicon dioxide.

3. The method of claim 2, wherein the second dielectric layer comprises silicon dioxide.

4. The method of claim 1, wherein the first dielectric layer comprises silicon dioxide.

5. A method of fabricating an integrated circuit transistor on a substrate, comprising the steps of:

forming a first dielectric layer on the substrate;

forming first and second source/drain regions in the substrate such that the first and second source drain/ regions are laterally spaced to define a channel region underlying the first dielectric layer;

forming a second dielectric layer on the substrate;

removing the first dielectric layer;

forming a third dielectric layer overlying the channel region; and forming a gate electrode on the third dielectric layer.

6. The method of claim 5, wherein the first dielectric comprises a layer of silicon dioxide on the substrate and a layer of silicon nitride formed on the layer of silicon dioxide.

7. The method of claim 6, wherein the second dielectric layer comprises silicon dioxide.

8. The method of claim 5, wherein the first dielectric layer comprises silicon dioxide.

9. The method of claim 8, wherein the second dielectric layer comprises silicon oxynitride.

10. The method of claim 8, wherein the second dielectric layer comprises silicon nitride.

11. The method of claim 5, wherein the first dielectric layer comprises silicon oxynitride.

12. The method of claim 11, wherein the second dielectric layer comprises silicon dioxide.

13. The method of claim 5, wherein the step of forming the first and second source/drain regions comprises implanting the substrate with a dopant species.

14. The method of claim 13, wherein the dopant species comprises arsenic.

15. The method of claim 5, wherein the step of forming the second dielectric layer comprises forming the dielectric layer on the substrate except where the first dielectric layer is located.

16. The method of claim 5, wherein the third dielectric layer comprises silicon dioxide.

17. The method of claim 5, wherein the step of forming the gate electrode comprises depositing a conducting material over the third dielectric layer.

18. A method of fabricating an integrated circuit transistor on a substrate, comprising the steps of:

forming a first dielectric layer on the substrate;

implanting the substrate with arsenic to form first and second source/drain regions in the substrate, the first and second source/drain regions being laterally spaced to define a channel region underlying the first dielectric layer;

forming a second dielectric layer on the substrate except where the first dielectric layer is positioned;

removing the first dielectric layer;

forming a gate oxide layer overlying the channel region; and forming a gate electrode on the gate oxide layer.

19. The method of claim 18, wherein the first dielectric comprises a layer of silicon dioxide on the substrate and a layer of silicon nitride formed on the layer of silicon dioxide.

20. The method of claim 19, wherein the second dielectric layer comprises silicon dioxide.

21. The method of claim 18, wherein the first dielectric layer comprises silicon dioxide.

22. The method of claim 21, wherein the second dielectric layer comprises silicon oxynitride.

23. The method of claim 21, wherein the second dielectric layer comprises silicon nitride.

24. The method of claim 18, wherein the first dielectric layer comprises silicon oxynitride.

25. The method of claim 24, wherein the second dielectric layer comprises silicon dioxide.

26. The method of claim 18, wherein the step of forming the second dielectric layer comprises forming the dielectric layer on the substrate except where the first dielectric layer is located.

27. The method of claim 18, wherein the step of forming the gate electrode comprises depositing a conducting material over the gate oxide layer.

28. A method of fabricating an integrated circuit transistor on a substrate, comprising the steps of:

forming a dielectric layer on the substrate;

forming first and second source/drain regions in the substrate such that the first and second source drain/ regions are laterally spaced to define a channel region underlying the dielectric layer;

forming a layer of silicon dioxide on the substrate;

removing the dielectric layer;

forming a second layer of silicon dioxide overlying the channel region; and forming a gate electrode on the second silicon dioxide layer.

29. The method of claim 28, wherein the step of forming the dielectric layer comprises growing a layer of silicon dioxide on the substrate and depositing a layer of silicon nitride on the layer of silicon dioxide.

30. The method of claim 28, wherein the step of forming the first layer of silicon dioxide comprises forming the second layer of silicon dioxide on the substrate except where the dielectric layer is located.

31. The method of claim 28, wherein the step of forming the gate electrode comprises depositing a conducting material over the second layer of silicon dioxide.

* * * * *